United States Patent
Hirotsu et al.

(10) Patent No.: US 8,421,441 B2
(45) Date of Patent: Apr. 16, 2013

(54) CURRENT-CONTROLLED SEMICONDUCTOR DEVICE AND CONTROL UNIT USING THE SAME

(75) Inventors: Teppei Hirotsu, Hitachi (JP); Nobuyasu Kanekawa, Hitachi (JP); Itaru Tanabe, Naka (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 338 days.

(21) Appl. No.: 12/868,236

(22) Filed: Aug. 25, 2010

(65) Prior Publication Data

US 2011/0101959 A1    May 5, 2011

(30) Foreign Application Priority Data

Oct. 30, 2009    (JP) .................................. 2009-250701

(51) Int. Cl.
*G01R 19/00*    (2006.01)

(52) U.S. Cl.
USPC .................................. 324/123 R; 324/750.3

(58) Field of Classification Search ........................ None
See application file for complete search history.

(56) References Cited

U.S. PATENT DOCUMENTS

| | | | | |
|---|---|---|---|---|
| 5,675,268 A | * | 10/1997 | Petty et al. | 327/77 |
| 5,784,245 A | * | 7/1998 | Moraghan et al. | 361/154 |
| 7,466,601 B2 | * | 12/2008 | Muller | 365/189.05 |
| 7,522,431 B2 | * | 4/2009 | Huynh et al. | 363/21.12 |

FOREIGN PATENT DOCUMENTS

| | | |
|---|---|---|
| JP | 2003-203805 | 7/2003 |
| JP | 2006-165100 | 6/2006 |

OTHER PUBLICATIONS

U.S. Appl. No. 12/826,429, filed Jun. 29, 2010, N. Kanekawa.
U.S. Appl. No. 12/855,428, filed Aug. 12, 2010, N. Kanekawa.

* cited by examiner

*Primary Examiner* — Minh N Tang
(74) *Attorney, Agent, or Firm* — Antonelli, Terry, Stout & Kraus, LLP.

(57) ABSTRACT

A current-controlled semiconductor device is provided which corrects fluctuations of both gain and offset of a current detection circuit to thereby enable high-accuracy current detection within a single-chip IC. The current-controlled semiconductor device is provided on the same semiconductor chip with a MOSFET, two constant current sources, and a current detection circuit which detects a current of the MOSFET and currents of the constant current sources. Further, the constant current sources are equipped with an external connecting terminal for measuring their current values. A correction measured-value holding register holds therein the current values of the constant current sources, which have been measured from outside.

8 Claims, 7 Drawing Sheets

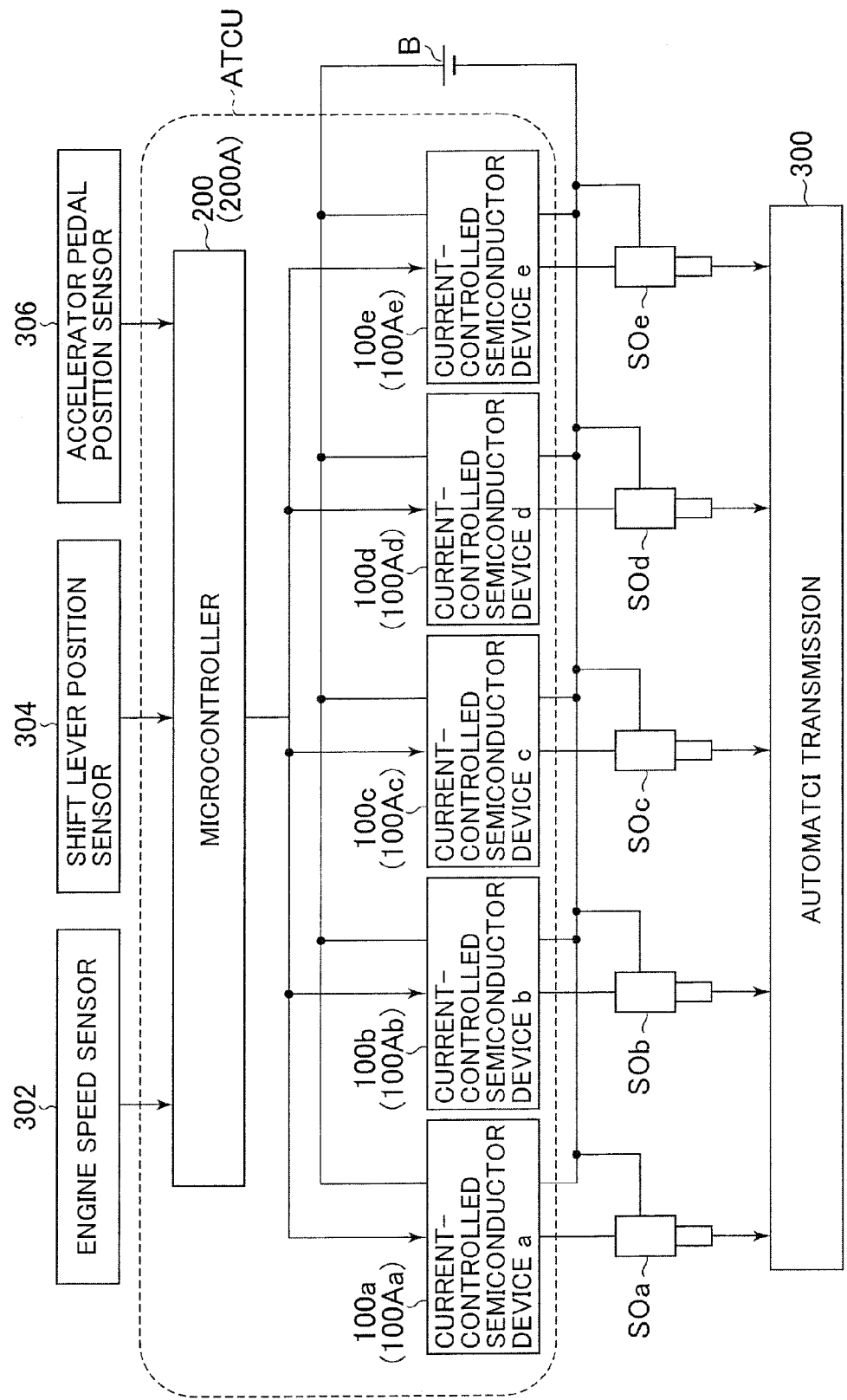

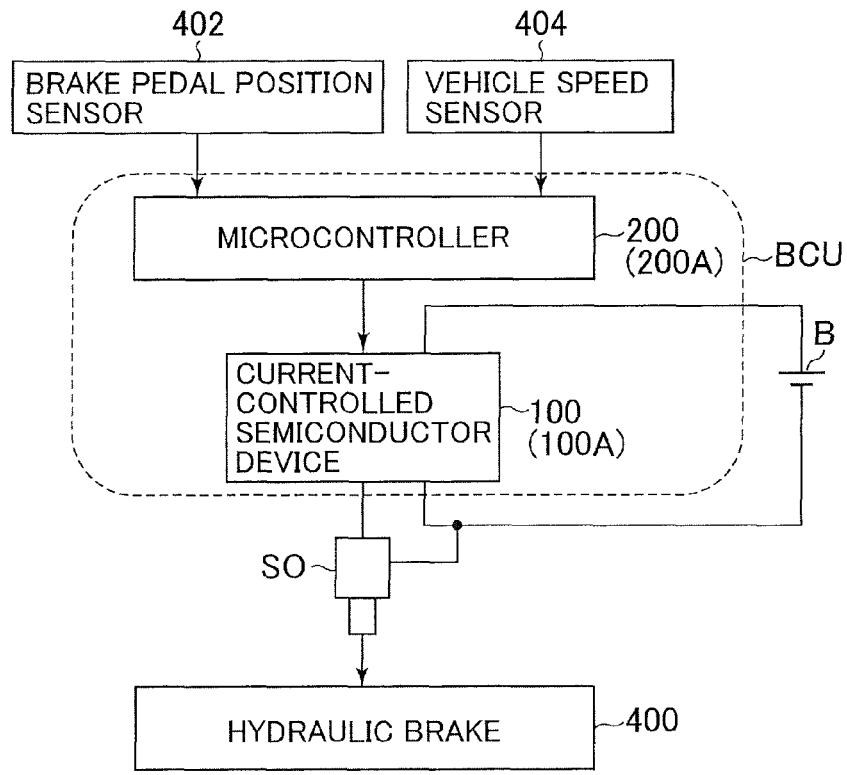
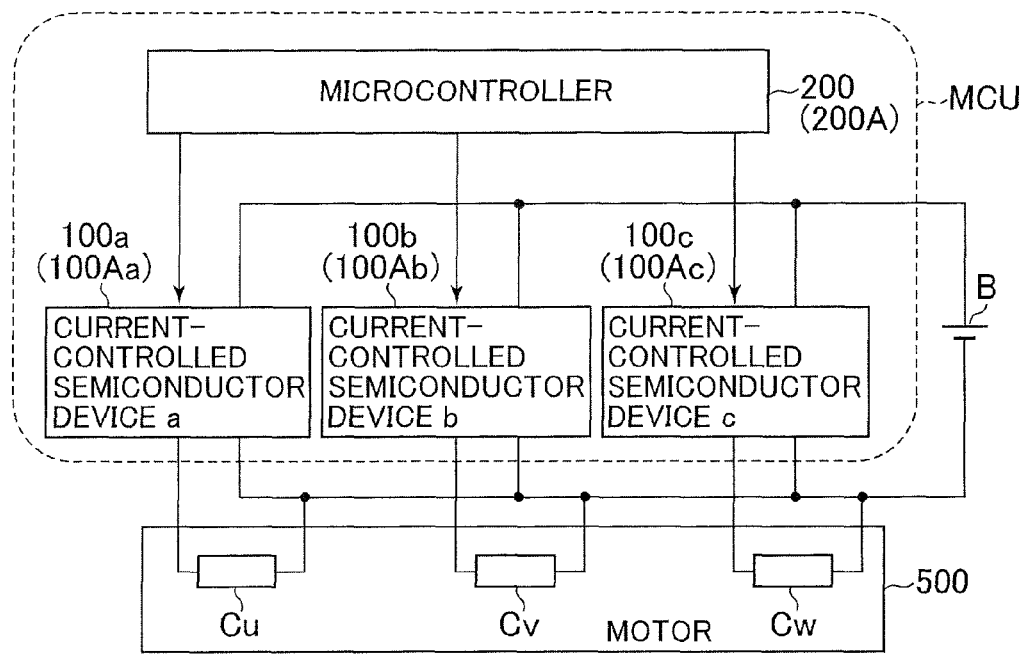

CURRENT-CONTROLLED SEMICONDUCTOR DEVICE AND CONTROL UNIT USING THE SAME

BACKGROUND OF THE INVENTION

1. Field of the Invention

The present invention relates to a current-controlled semiconductor device and a control unit using the same, and particularly to a current-controlled semiconductor device suitable for incorporating a current detection circuit into an IC chip and a control unit using the same.

2. Description of the Related Art

As various targets to be controlled become electrically controlled, electromotive actuators such as a motor, a solenoid, etc. are being widely utilized to convert an electric signal into mechanical motion or hydraulic pressure. High-accuracy current control is essential to greater sophistication of these electromotive actuators. In recent years, it has become a common practice to use digital feedback control for the purpose of the high-accuracy current control.

The digital feedback control on the current needs to acquire a digital value of a current value Iout to be controlled. To this end, an output Vout of a current-voltage conversion circuit is digitally converted by an AD converter to obtain a digital value Voutd (=Vout/Vref) corresponding to a value relative to a reference voltage Vref of the AD converter. Next, a correction corresponding to the input/output characteristics of a current detection circuit including the current-voltage conversion circuit and the AD converter is performed on the output Voutd of the AD converter to obtain a digital value of a current value Ioutd.

Various configurations are considered for the current detection circuit, but the input/output characteristics of the current detection circuit are desirably linear in terms of simplification of a control algorithm. In this case, the digital current value Ioutd is determined from the following equation (1) using a gain $a$ and an offset $b$:

$$Ioutd = a \cdot Voutd + b \quad (1)$$

How the gain a and the offset b should be made coincident with the actual characteristics of the current detection circuit with satisfactory accuracy where the current value is measured in accordance with the equation (1), is important in improving the accuracy of current measurements.

There is also a growing need for a reduction in the size and cost of a control unit in addition to the high-accuracy current control. Provision is made for it by incorporating the current detection circuit into an IC chip. There has been known one in which a current detecting resistor is incorporated into the IC chip, for the purpose of incorporating the current detection circuit into the IC chip here (refer to, for example, JP-2003-203805-A and JP-2006-165100-A).

Incorporating the current detecting resistor into the IC chip as described in JP-2003-203805-A and JP-2006-165100-A enables a reduction in the number of external parts for current detection and is a method excellent in the size and cost reduction of the control unit.

The value of the resistor formed within the IC chip, however, fluctuates a few tens of percent with the temperature. This appears as a fluctuation in the gain a of the equation (1) as it is. A fluctuation in the reference voltage Vref of the AD converter used for the digital conversion of the detected current value also leads to a few percent fluctuation in the gain a. Further, the offset b of the equation (1) also fluctuates a few percent due to an input offset of an operational amplifier used in the current detection circuit.

A problem arises in that when the current detection circuit is incorporated into the IC chip, the gain a and the offset b in the equation (1) greatly fluctuate as compared with design values, thus causing an increase in current detection error.

SUMMARY OF THE INVENTION

An object of the present invention is to provide a current-controlled semiconductor device which corrects fluctuations in the gain a and offset b of the equation (1) in the current detection circuit to thereby enable high-accuracy current detection within a single-chip IC, and a control unit using the same.

(1) In order to achieve the above object, the present invention provides a current-controlled semiconductor device comprising a MOSFET, at least two constant current sources, and a current detection circuit for detecting a current of the MOSFET and currents of the constant current sources, which are provided on the same semiconductor chip, wherein the constant current sources are equipped with an external connecting terminal for measuring values of the currents thereof.

Owing to such a configuration, high-accuracy current detection is made possible within a single-chip IC by correcting fluctuations in the gain a and offset b of the current detection circuit.

(2) Preferably, in the above (1), there is provided the current-controlled semiconductor device, further comprising a memory element for retaining therein the current values of the constant current sources measured from outside using the external connecting terminal or detected values obtained when the current detection circuit has measured the currents of the constant current sources.

(3) Preferably, there is provided the current-controlled semiconductor device, wherein in the above (2), there are further provided correction value calculating means for calculating corrected values of both gain and offset of the current detection circuit using the values retained in the memory element, and current value calculating means for correcting the corresponding value detected by the current detection circuit using the corrected values of the gain and offset calculated by the correction value calculating means to thereby calculate a corrected current value.

(4) Preferably, there is provided the current-controlled semiconductor device, wherein in the above (3), the correction value calculating means performs a start decision as to the correction value calculating circuit using a temperature measured value of the current-controlled semiconductor device when a difference between the temperature measured value and a temperature at the time that correction is performed last time is greater than or equal to a predetermined value.

(5) Preferably, there is provided the current-controlled semiconductor device, wherein in the above (4), the current-controlled semiconductor device turns on and off a voltage flowing through a load by PWM, wherein when an off period of the PWM is longer than a period required to measure the currents of the two constant current sources, the correction value calculating means measures the currents of the two constant current sources during the off period of the PWM, and wherein when the off period of the PWM is shorter than the period required to measure the currents of the two constant current sources, the correction value calculating means measures the currents of the two constant current sources during a period other than at the instant following a PWM on within an on period of the PWM.

(6) In order to achieve the above object, the present invention provides a control unit comprising at least one current-controlled semiconductor device, and a microcontroller for controlling the current-controlled semiconductor device, wherein the current-controlled semiconductor device is provided on the same semiconductor chip with a MOSFET, at least two constant current sources, a current detection circuit for detecting a current of the MOSFET and currents of the constant current sources, and a memory element for retaining therein detected values obtained when the current detection circuit has measured the currents of the constant current sources, and wherein the microcontroller includes correction value calculating means for calculating corrected values of both gain and offset of the current detection circuit using the values retained in the memory element, and current value calculating means for correcting the corresponding value detected by the current detection circuit using the corrected values of the gain and offset calculated by the correction value calculating means to thereby calculate a corrected current value.

Owing to such a configuration, high-accuracy current detection is made possible within a single-chip IC by correcting fluctuations in the gain $\underline{a}$ and offset $\underline{b}$ of the current detection circuit.

(7) Preferably, there is provided the control unit, wherein in the above (6), the correction value calculating means performs a start decision as to the correction value calculating circuit using a temperature measured value of the current-controlled semiconductor device when a difference between the temperature measured value and a temperature at the time that correction is performed last time is greater than or equal to a predetermined value.

(8) Preferably, there is provided the control unit wherein in the above (7), the current-controlled semiconductor device turns on and off a voltage flowing through a load by PWM, wherein when an off period of the PWM is longer than a period required to measure the currents of the two constant current sources, the correction value calculating means measures the currents of the two constant current sources during the off period of the PWM, and wherein when the off period of the PWM is shorter than the period required to measure the currents of the two constant current sources, the correction value calculating means measures the currents of the two constant current sources during a period other than at the instant following a PWM on within an on period of the PWM.

According to the present invention, it is possible to carry out high-accuracy current detection within a single-chip IC by correcting fluctuations in the gain $\underline{a}$ and offset $\underline{b}$ of the current detection circuit.

BRIEF DESCRIPTION OF THE DRAWINGS

FIG. 8 is a block diagram showing a configuration of an automatic transmission control unit using current-controlled semiconductor devices according to respective embodiments of the present invention;

FIG. 9 is a block diagram depicting a configuration of a brake control unit using the current-controlled semiconductor device according to each embodiment of the present invention; and FIG. 10 is a block diagram illustrating a configuration of a brushless motor control unit using the current-controlled semiconductor devices according to the respective embodiments of the present invention.

DESCRIPTION OF THE PREFERRED EMBODIMENTS

A configuration and operation of an electromotive actuator using a current-controlled semiconductor device according to one embodiment of the present invention will hereinafter be explained using FIGS. 1 through 6.

An overall configuration of the electromotive actuator using the current-controlled semiconductor device according to the present embodiment will first be described using FIG. 1.

Figure 1:
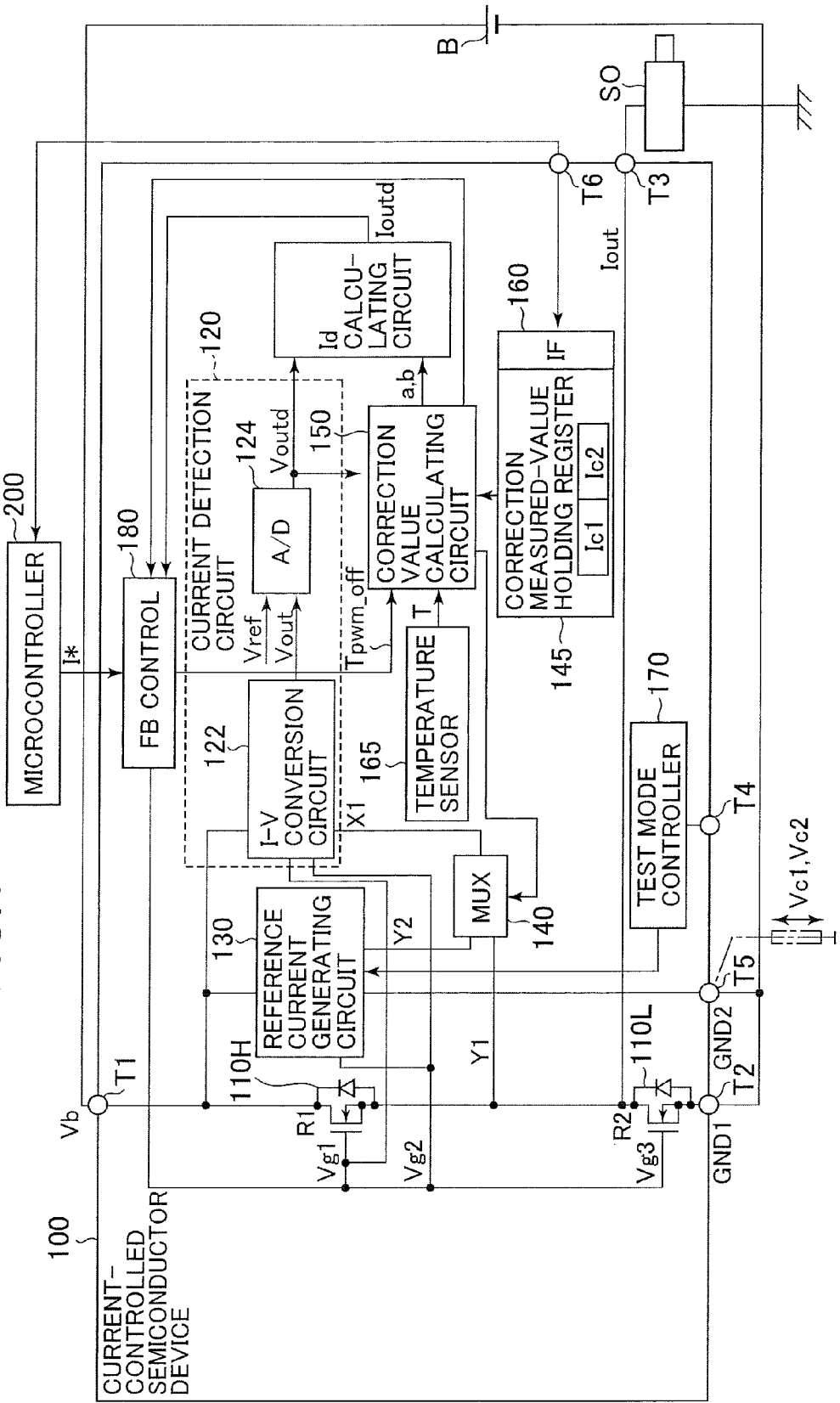
FIG. 1 is a block diagram showing an overall configuration of an electromotive actuator using a current-controlled semiconductor device according to one embodiment of the present invention.

FIG. 1 is a block diagram showing the overall configuration of the electromotive actuator using the current-controlled semiconductor device according to the one embodiment of the present invention.

The current-controlled semiconductor device 100 is of a single IC chip. A high-side MOSFET 110H, a low-side MOSFET 110L, a current detection circuit 120, a reference current generating circuit 130, a multiplexer 140, a correction measured-value holding register 145, a correction value calculating circuit 150, a digital current calculating circuit 155, an IF circuit 160, a temperature sensor 165, a test mode controller 170, and a feedback controller 180 are incorporated in the current-controlled semiconductor device 100 over the same semiconductor device chip. The current detection circuit 120 is equipped with a current-voltage conversion circuit 122 and an AD converter 124.

The high-side MOSFET 110H and the low-side MOSFET 110L are connected in series. Namely, a source terminal of the high-side MOSFET 110H is connected to a drain terminal of the low-side MOSFET 110L. A drain terminal of the high-side MOSFET 110H is connected to an external connecting terminal T1 of the current-controlled semiconductor device 100. A DC voltage Vb is applied to the external connecting terminal T1 from an external battery B. A source terminal of the low-side MOSFET 110L is connected to an external connecting terminal T2 and grounded outside the current-controlled semiconductor device 100.

A connecting portion of the source terminal of the high-side MOSFET 110H and the drain terminal of the low-side MOSFET 110L is connected to an external connecting terminal T3. A solenoid SO aimed at current control is connected to the external connecting terminal T3 and supplied with a current Iout. A gate signal Vg1 is input from the feedback controller 180 to a gate terminal of the high-side MOSFET 110H. A gate signal Vg3 is input from the feedback controller 180 to a gate terminal of the low-side MOSFET 110L. The feedback controller 180 outputs the gate signal Vg1, the gate signal Vg3, and a gate signal Vg2 to be described later, in parallel.

When the gate signal Vg1 of the high-side MOSFET 110H is at a high level, the high-side MOSFET 110H is turned ON by a switch lying between the solenoid SO and the battery B, whereas when the gate signal Vg1 thereof is at a low level, the high-side MOSFET 110H is turned OFF by the switch. When the high-side MOSFET 110H is turned ON, the current flowing through the solenoid SO increases, and when the high-side MOSFET 110H is turned OFF, the current decreases.

When the high-side MOSFET 110H is OFF, the low-side MOSFET 110L is used as a path for causing the current flowing through the solenoid SO to flow back. When the high-side MOSFET 110H is in an OFF period, the low-side MOSFET 110E is turned ON. Incidentally, a dead time may be provided during which the high-side MOSFET 110H and the low-side MOSFET 110L are both turned OFF.

The current-controlled semiconductor device 100 switches the voltage applied to the solenoid SO ON and OFF to control the current Iout flowing through the solenoid SO by PWM (Pulse Width Modulation), thereby driving the solenoid SO.

When a terminal X1 of the current-voltage conversion circuit 122 is connected to a connecting point Y1 of the high-side MOSFET 110H and the low-side MOSFET 110L by the multiplexer 140, the current-voltage conversion circuit 122 is connected in parallel with the high-side MOSFET 110H. Thus, the current-voltage conversion circuit 122 detects the current flowing through the high-side MOSFET 110H and converts the current to a voltage Vout, followed by outputting it therefrom.

A configuration of the current-voltage conversion circuit 122 used in the current-controlled semiconductor device according to the present embodiment will now be explained using FIG. 2.

Figure 2:
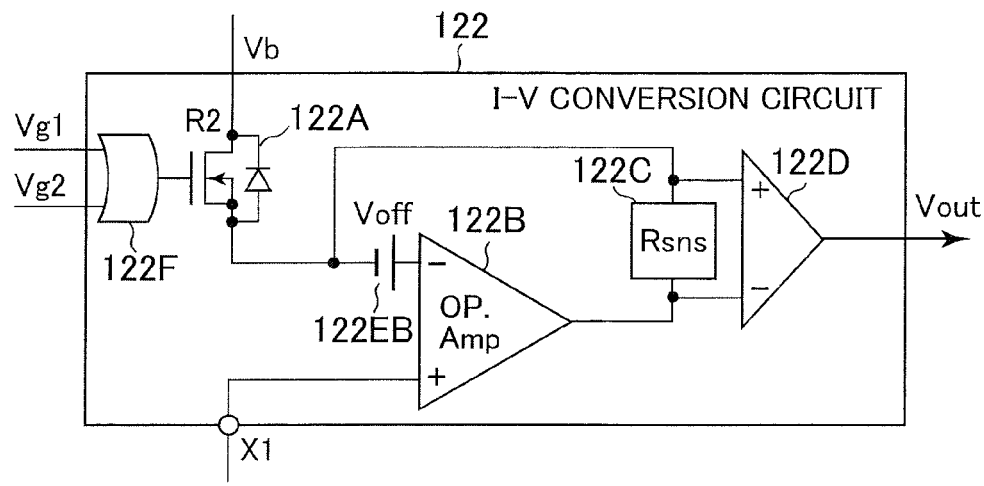
FIG. 2 is a circuit diagram illustrating a configuration of a current-voltage conversion circuit used in the current-controlled semiconductor device according to the one embodiment of the present invention.

FIG. 2 is a circuit diagram showing the configuration of the current-voltage conversion circuit used in the current-controlled semiconductor device according to the one embodiment of the present invention.

The current-voltage conversion circuit 122 is equipped with a sense MOSFET 122A, an operational amplifier 122B, a sense resistor (current detection resistor) 122C, a differential amplifier 122D, an offset voltage source 122E, and an OR circuit 122F.

The sense MOSFET 122A is turned ON when the gate signal Vg1 is high in level, i.e., the high-side MOSFET 110H is being energized. When the sense MOSFET 122A is ON, the current flowing through the sense MOSFET 122A also flows through the sense resistor 122C. The differential amplifier 122D detects a voltage applied across the sense resistor 122C, converts the value of the current to its corresponding voltage and outputs it as Vout.

As is understood by comparison between FIGS. 1 and 2 herein, when the terminal X1 of the current-voltage conversion circuit 122 is connected to the connecting point Y1 of the high-side MOSFET 110H and the low-side MOSFET 110L, the high-side MOSFET 110H and the sense MOSFET 122A are connected in parallel. When the high-side MOSFET 110H is ON, the current flowing through the high-side MOSFET 110H is 1 A, for example. On the other hand, a current of 0.1 A equal to 1/10 of 1 A flows through the sense MOSFET 122A. Therefore, a gate width of the sense MOSFET 122A is made narrower than a gate width of the high-side MOSFET 110H. Thus, since the current flowing through the sense resistor 122C can be made small, power consumption of the sense resistor 122C can be reduced. Incidentally, the shunt ratio between the high-side MOSFET 110H and the sense MOSFET 122A can be set to about 1/10 to about 1/100 without being limited to 1/10.

A negative terminal of the operational amplifier 122B is connected to a source terminal of the sense MOSFET 122A, and a positive terminal thereof is connected to the terminal X1, i.e., the connecting point of the high-side MOSFET 110H and the low-side MOSFET 110L. The operational amplifier 122B controls both voltages in such a manner that they become constant. Since the on resistance of the sense MOSFET 122A changes where the voltage of the gate signal Vg1 of the sense MOSFET 122A changes, the above control is done to prevent the influence of its change.

The offset voltage source 122E is of an internal parasitic voltage of the I-V conversion circuit 122, which is equivalent to the offset voltage $\bar{b}$ in the above equation (1). Since a change in the offset voltage $\bar{b}$ influences the accuracy of current detection, this influence is eliminated by a method to be described later.

Since the OR circuit 122F ORs the gate signal Vg1 and the gate signal Vg2, the OR circuit 122F is turned ON while the gate signal Vg2 is high in level, i.e., a MOSFET lying inside the reference current generating circuit 130 is being energized. When the sense MOSFET 122A is ON, the current flowing through the sense MOSFET 122A also flows through the sense resistor 122C. The differential amplifier 122D detects a voltage applied across the sense resistor 122C, converts the value of the reference current to its corresponding voltage and outputs it as Vout. An internal configuration of the reference current generating circuit 130 will be described later using FIG. 3.

Here, a polysilicon resistor or the like capable of being incorporated in the IC chip is used as the sense resistor 122C. On the other hand, when the sense resistor is externally attached to the outside of the IC chip, a print resistor or the like is used. The print resistor can be adjusted to a predetermined resistance value by a technique such as trimming or the like and is resistant to a change in temperature. On the other hand, the polysilicon resistor or the like changes in resistance value according to the temperature. As a result, it is necessary to correct the gain $\bar{a}$ in the above equation (1) because the gain $\bar{a}$ changes.

Referring to FIG. 1 again, the reference current generating circuit 130 generates a reference current for correcting the offset $\bar{b}$ and gain $\bar{a}$ of the current detection circuit 120 from the current-voltage conversion circuit 122 to the AD converter 124 and operates when the gate signal Vg2 is high in level.

A configuration of the reference current generating circuit 130 used in the current-controlled semiconductor device according to the present embodiment will now be explained using FIG. 3.

Figure 3:
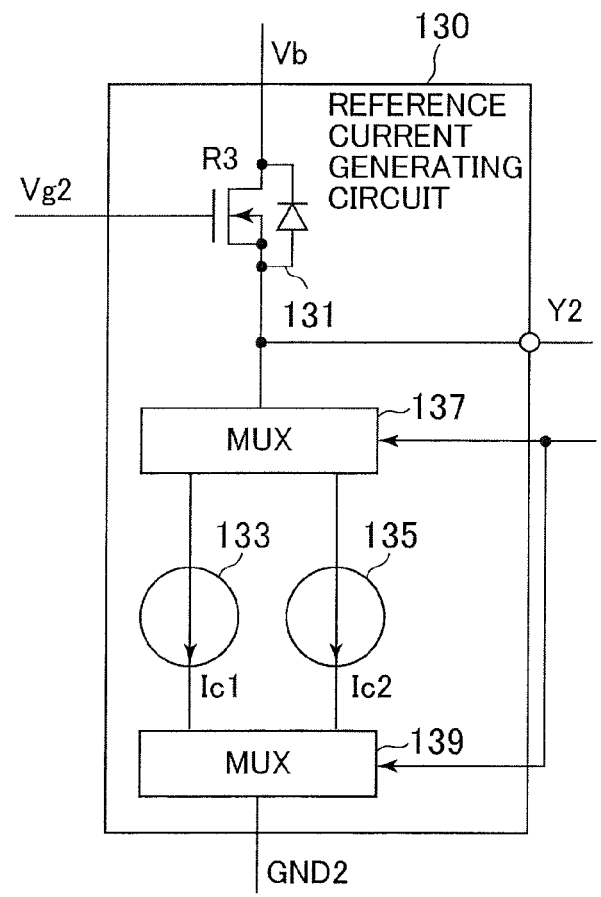
FIG. 3 is a circuit diagram depicting a configuration of a reference current generating circuit used in the current-controlled semiconductor device according to the one embodiment of the present invention.

FIG. 3 is a circuit diagram showing the configuration of the reference current generating circuit used in the current-controlled semiconductor device according to the one embodiment of the present invention.

The reference current generating circuit 130 comprises a MOSFET 131, two constant current sources 133 and 135, and two multiplexers 137 and 139. The constant current source 133 is a constant current source of a current value Ic1, and the constant current source 135 is a constant current source of a current value Ic2. The current values Ic1 and Ic2 are set to be 1/10 to 1/100 of the current flowing through the high-side MOSFET 110H of FIG. 1. For example, assuming that the maximum value of the current flowing through the high-side MOSFET 110H is 1 A, the current value Ic1 is set to be 0.1 and the current value Ic2 is set to be 0.05.

When the gate signal Vg2 is now high in level, the MOSFET 131 is turned ON so that the current generated by the constant current source 133 or the constant current source 135 flows. The passage of current by either the constant current source 133 or the constant current source 135 is selected by the multiplexer 137 or 139 operated in accordance with a signal supplied from the correction value calculating circuit 150.

When the terminal X1 of the current-voltage conversion circuit 122 is connected to a terminal Y2 (terminal Y2 in FIG. 3) of the reference current generating circuit 130 in FIG. 1 here, the MOSFET 131 and the sense MOSFET 122A are connected in parallel. When the MOSFET 131 is ON, the current flowing through the MOSFET 131 is Ic1 or Ic2. On the other hand, a current equal to 1/10 of the current flows through the sense MOSFET 122A. Therefore, the gate width of the sense MOSFET 122A is made narrower than that of the MOSFET 131. Thus, since the current flowing through the sense resistor 122C can be made small, power consumption of the sense resistor 122C can be reduced.

Thus, when the gate signal Vg2 is high in level, i.e., the sense MOSFET 122A of FIG. 2 is ON while the MOSFET 131 lying inside the reference current generating circuit 130 is being energized, the current flowing through the sense MOSFET 122A is taken as the voltage applied across the sense resistor 122C and detected by the differential amplifier 122D, which in turn converts the value of the reference current into its corresponding voltage and outputs it as each of Voutc1 and Voutc2.

Referring to FIG. 1 again, the AD converter 124 digitally converts the output Vout of the current-voltage conversion circuit 122 and outputs a digital value Voutd (=Vout/Vref) corresponding to a value relative to a reference voltage Vref. When the reference currents Ic1 and Ic2 are being detected, the AD converter 124 outputs digital values Voutdc1 and Voutdc2 relative to the detected values of reference currents.

The correction measured-value holding register 145 holds the current values Ic1 and Ic2 of the constant current sources included in the reference current generating circuit 130 therein for the correction of the gain a and offset b for current detection.

The correction value calculating circuit 150 calculates the offset b and gain a for the current detection from the digital values Voutdc1 and Voutdc2 relative to the detected values of reference currents, of the output of the AD converter 124, and the current values Ic1 and Ic2 of the constant current sources, which are held in the correction measured-value holding register 145.

The correction value calculating circuit 150 performs a constant current source measurement for correction and a start decision as to the gain/offset correction by the correction value calculating circuit 150 in accordance with an output T produced from the temperature sensor 165 and a PWM off-period value Tpwm_off sent from the feedback controller 180. The temperature sensor 165 outputs a digital value T of the temperature of the current-controlled semiconductor device 100. When the temperature detected by the temperature sensor 165 is changed to a predetermined temperature or higher, the correction value calculating circuit 150 starts correction value calculating operation.

The current value calculating circuit 155 calculates a digital current value Ioutd from the output Voutd of the AD converter 124 and the offset b and gain a for the current detection both calculated by the correction value calculating circuit 150, in accordance with the following equation (1):

$$Ioutd = a \cdot Voutd + b \quad (1)$$

The IF (interface) circuit 160 has an interface function for reading/writing the values retained in the correction measured-value holding register 145 from the outside of the current-controlled semiconductor device 100.

The test mode controller 170 is started up from outside via a terminal T4. In the example shown in FIG. 1, a terminal T5 is grounded. In a test mode, however, a sense resistor Rsns2 is connected to the terminal T5 as indicated by a one-dot chain line. Upon the startup of the test mode controller 170, the test mode controller 170 controls the reference current generating circuit 130 to output the currents flowing through the reference current generating circuit 130 to the terminal T5 and accurately measures values Ic1 and Ic2 of the currents flowing through the reference current generating circuit 130 as voltage values Vc1 and Vc2 by the external sense resistor Rsns 2. Thus, the provision of the external connecting terminal at which the current values Ic1 and Ic2 of the constant current sources can be measured accurately, is also one feature of the current-controlled semiconductor device 100 according to the present embodiment.

The current values Ic1 and Ic2 determined by the measurement have been stored in advance in a non-volatile memory such as an EP-ROM or the like lying inside a microcontroller 200. On the other hand, when the supply of power to the current-controlled semiconductor device 100 is stopped, the correction measured-value holding register 145 lying inside the current-controlled semiconductor device 100 loses the values retained therein. Thus, when the energization to the current-controlled semiconductor device 100 is restarted, the current values Ic1 and Ic2 held in the microcontroller 200 are written into the correction measured-value holding register 145 through the interface circuit 160. Incidentally, when it is possible to incorporate the non-volatile memory like EP-ROM into the current-controlled semiconductor device 100, the current values Ic1 and Ic2 determined by the measurement can be written into the non-volatile memory.

The feedback controller 180 controls energizing time periods of the gate signals Vg1 and Vg3 in such a manner that the digital current value Ioutd calculated by the current value calculating circuit 155 becomes equal to a control current target value I* supplied from the microcontroller 200, and turns ON and OFF the voltage applied to the solenoid SO to control the current Iout flowing through the solenoid SO by PWM. The feedback controller 180 outputs the gate signal Vg2 where the corresponding reference current is detected, based on instructions from the correction value calculating circuit 150.

The characteristics of the current detection circuit 120 from the current-voltage conversion circuit 122 to the AD converter 124, which have been described using FIGS. 1 through 3, will next be explained using numerical expressions.

Assuming that the on resistance value of the high-side MOSFET 110H is R1, the on resistance value of the sense MOSFET 122A is R2, the input offset voltage of the operational amplifier 122B included in the current-voltage conversion circuit 122 is Voff, and the resistance value of the sense resistor 122C is Rsns, a relationship between the current Tout flowing through the solenoid SO when the high-side MOSFET 110H is ON, and the output Voutd of the AD converter 124 is as expressed in the following equation (2):

$$Ioutd = ((R2/R1) \cdot (Vref/Rsns)) \cdot Voutd + (Voff/R1) \quad (2)$$

Assuming now that the gain and offset for the current detection where the current of the solenoid SO is measured are a and b, respectively, they are given as expressed in the following equations (3) and (4):

$$a = (R2/R1) \cdot (Vref/Rsns) \quad (3)$$

$$b = (Voff/R1) \quad (4)$$

On the other hand, assuming that when the current of the reference current generating circuit 130 is measured, the value of the current of the reference current generating circuit 130 is Ic and the on resistance value of the MOSFET 131 included in the reference current generating circuit 130 is R3, a relationship between the current value Ic and the output Voutd of the AD converter 124 is as expressed in the following equation (5):

$$Ic = ((R2/R3) \cdot (Vref/Rsns)) \cdot Voutd + (Voff/R3) \quad (5)$$

Assuming now that the gain and offset for the current detection where the current of the reference current generating circuit 130 is measured are a1 and b1, respectively, they are given as expressed in the following equations (6) and (7):

$$a1 = (R2/R3) \cdot (Vref/Rsns) \quad (6)$$

$$b = (Voff/R3) \quad (7)$$

Deriving relational expressions between the gains a and a1 and the offsets b and b1 from the equations (3), (4), (6), and (7) yields the following:

$$a = (R3/R1) \cdot a1 \quad (8)$$

$$b = (R3/R1) \cdot b1 \quad (9)$$

Since the ratio between the on resistance value R1 of the high-side MOSFET 110H and the on resistance value R3 of the MOSFET 131 can be matched with a design value with a high degree of accuracy, a and b can be determined indirectly if a1 and b1 are found.

Using the characteristics of the current detection circuit 120, which have been described above, the correction value calculating circuit 150 performs arithmetic operations on the gain a and offset b for the current detection where the current of the solenoid SO is measured. A method for determining the gain a and the offset b by the correction value calculating circuit 150 will be explained below.

Assuming that the current value of the constant current source 133 provided in the reference current generating circuit 130 is Ic1, the current value of the constant current source 135 provided therein is Ic2, the output value of the AD converter 124 at the time that the current value of the constant current source 133 is measured, is Voutdc1, and the output value of the AD converter 124 at the time that the current value of the constant current source 135 is measured, is Voutdc2, the gain a1 and the offset b1 can be solved from the equation (5) as follows:

$$a1 = (Ic1 - Ic2)/(Voutdc1 - Voutdc2) \quad (10)$$

$$b1 = ((Ic2 \cdot Voutdc1) - (Ic1 \cdot Voutdc2)/(Voutdc1 - Voutdc2) \quad (11)$$

Here, the current value Ic1 of the constant current source 133 and the current value Ic2 of the constant current source 135 are measured with high accuracy from outside using the test mode controller 170 and stored in the non-volatile memory or the like of the microcontroller 200 in advance. When the current-controlled semiconductor device 100 is started up, the values of Ic1 and Ic2 are transferred to the current measurement-based correction measured-value holding register 145 via the IF circuit 160.

Thus, the correction value calculating circuit 150 is capable of measuring the digital values Voutdc1 and Voutdc2 relative to the correcting currents Ic1 and Ic2 at arbitrary timings necessary for correction, determining the gain a1 and the offset b1 from the equations (10) and (11) using the current values Ic1 and Ic2 stored in the current measurement-based correction measured-value holding register 145 and further determining the gain a and the offset b from the equations (8) and (9).

While correction errors of the gain a and the offset b determined by the correction value calculating circuit 150, which have been described above, depend on absolute errors of the current value Ic1 of the constant current source 133 and the current value Ic2 of the constant current source 135, the current values of these constant current sources have fluctuations close to zero in principle irrespective of the power supply and the temperature. It is therefore possible to correct the gain a and the offset b with high accuracy.

After the above processing, the current value calculating circuit 155 calculates a digital current value Ioutd from the output Voutd of the AD converter 124 and the offset b and the gain a for the current detection, which have been calculated by the correction value calculating circuit 150, in accordance with the following equation (1):

$$Ioutd = a \cdot Voutd + b \quad (1)$$

According to the present embodiment as described above, it is possible to correct the gain a and the offset b with a high degree of accuracy and thereby perform high-accuracy current measurements.

A correction start decision and a measurement process of the correction value calculating circuit 150 in the current-controlled semiconductor device according to the present embodiment will next be explained using FIGS. 4 through 6.

Figure 4:
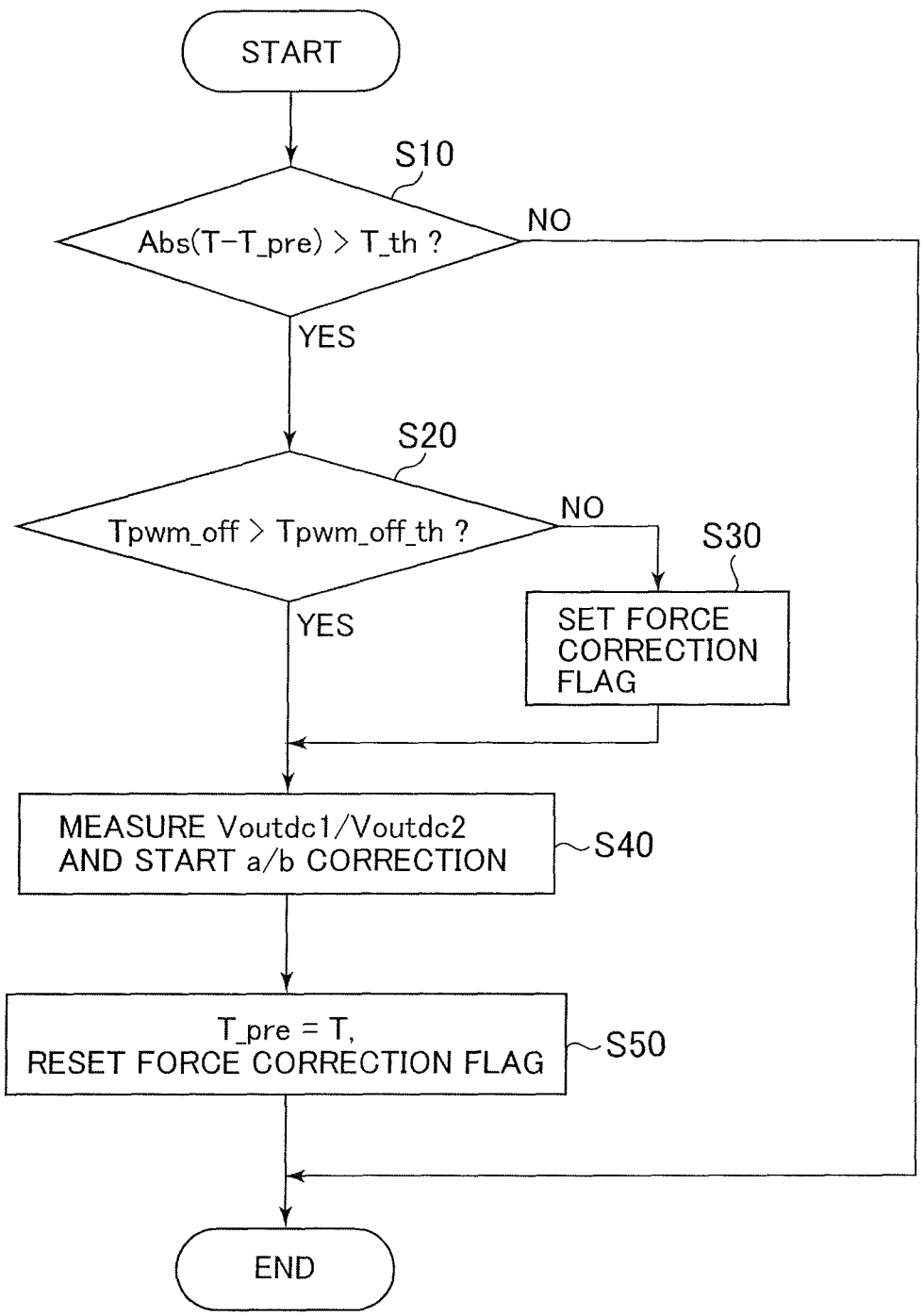
FIG. 4 is a flowchart showing the contents of a correction start decision and a measurement process of a correction value calculating circuit in the current-controlled semiconductor device according to the one embodiment of the present invention.

FIG. 4 is a flowchart showing the contents of the correction start decision and the measurement process of the correction value calculating circuit in the current-controlled semiconductor device according to the one embodiment of the present invention. FIGS. 5 and 6 are respectively timing charts showing the contents of the correction start decision and the measurement process of the correction value calculating circuit in the current-controlled semiconductor device according to the one embodiment of the present invention.

FIG. 4 shows an algorithm for setting a flag used for controlling the correction start decision and correcting measurement timings at the correction value calculating circuit 150.

At Step S10, the correction value calculating circuit 150 first determines whether the absolute value of a difference between an output T of the temperature sensor 165 and an output T_pre of the temperature sensor 165 at the time that correction is performed last time, is larger than a threshold value T_th. When the absolute value is found to be larger than the threshold value T_th, the correction value calculating circuit 150 proceeds to Step S20 and terminates the algorithm if not so.

Since the gain a and the offset b fluctuate depending on the temperature, the measurement of Voutdc1 and Voutdc2 and the correction of the gain a and the offset b by the correction value calculating circuit 150 are performed only when a fluctuation greater than or equal to a constant level exists in each of the gain a and the offset b from the determination of Step S10, thereby making it possible to reduce power with the correction. Although the threshold value T_th is set as 10° C., for example, it may be made lower than 10° C. to enhance the accuracy. Alternatively, the threshold value T_th may be made larger than 10° C. to decrease the frequency of correction processing.

Next, at Step S20, the correction value calculating circuit 150 determines whether an off period Tpwm_off of PWM is larger than a given threshold value Tpwm_off_th. Here, the threshold value Tpwm_off_th is set to a period during which Voutd at two points can be measured. The threshold value Tpwm_off_th is 10 µs, for example. When the off period Tpwm_off is larger than the threshold value Tpwm_off_th, the correction value calculating circuit 150 proceeds to Step S40. If not so, then the correction value calculating circuit 150 sets a force correction flag at Step S30 and proceeds to Step S40.

Next, at Step S40, the correction value calculating circuit 150 starts the measurements of the digital values Voutdc1 and Voutdc2 of the reference currents and the correction of the gain $\underline{a}$ and the offset $\underline{b}$ by the correction value calculating circuit 150. Finally, at Step S50, the correction value calculating circuit 150 updates T_pre and resets the force correction flag, thereby leading to the completion of the algorithm.

Figure 5:
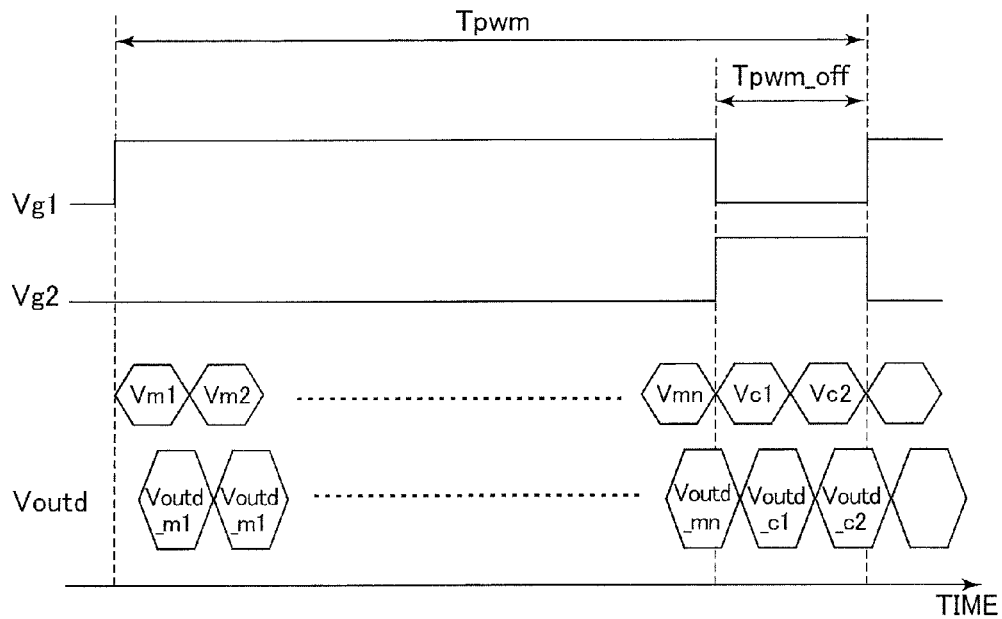
FIG. 5 is a timing chart illustrating the contents of the correction start decision and the measurement process of the correction value calculating circuit in the current-controlled semiconductor device according to the one embodiment of the present invention.

FIG. 5 is a timing chart for measuring the digital values Voutdc1 and Voutdc2 of reference currents where the force correction flag described in FIG. 4 is not set (the answer is YES at Step S20 of FIG. 4).

The measurement of the digital values Voutdc1 and Voutdc2 of the reference currents is preferably carried out at timings free of interference with the normal current measurements of Voutd_m1 through Voutd_mn in improving the current measurement accuracy over a PWM on period. Therefore, the PWM off period Tpwm_off is larger than the threshold value Tpwm_off_th. Namely, when the PWM off period is large enough to measure the two points of the digital values Voutdc1 and Voutdc2 of the reference currents, the digital values Voutdc1 and Voutdc2 of the reference currents are measured during the off period of PWM.

Figure 6:
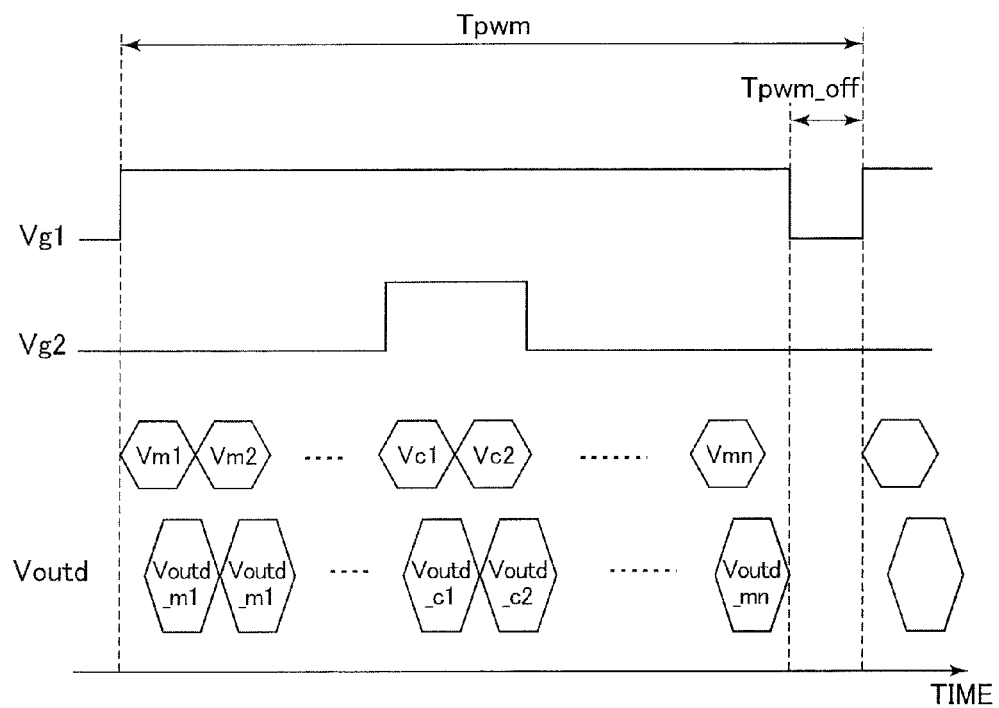
FIG. 6 is a timing chart showing other contents of the correction start decision and the measurement process of the correction value calculating circuit in the current-controlled semiconductor device according to the one embodiment of the present invention.

FIG. 6 is a timing chart for measuring digital values Voutdc1 and Voutdc2 of reference currents where the force correction flag described in FIG. 4 is set (the answer is NO at Step S20 of FIG. 4).

When the force correction flag is set, i.e., the PWM off period is not large enough to measure two points of the digital values Voutdc1 and Voutdc2 of the reference currents, the measurement of the digital values Voutdc1 and Voutdc2 of the reference currents is inserted between the normal current measurements (measurements of Voutd_m1 through Voutd_mn). Incidentally, since a change in current is steep immediately after PWM is turned ON, the points to measure the digital values Voutdc1 and Voutdc2 of the reference currents may preferably be avoided immediately after the PWM on in improving the accuracy of current measurement over the PWM on period.

As described above, the correction of the gain $\underline{a}$ and the offset $\underline{b}$ by the correction value calculating circuit 150 can be performed while suppressing the degradation of the current measurement accuracy to the minimum over the PWM entire period, by controlling the timings provided for the measurements of the digital values Voutdc1 and Voutdc2 of the reference currents in accordance with the decision at Step S20.

According to the present embodiment as described above, since the current values of the constant current sources incorporated in the IC chip are measured and the correction of the current detection circuit is carried out, the high-precision current detecting means can be realized within the single-chip IC.

Since the current values of the constant current sources are corrected using the values measured with a high degree of accuracy from outside in advance, the accuracy of correction can be enhanced.

A configuration and operation of an electromotive actuator using a current-controlled semiconductor device according to another embodiment of the present invention will next be explained using FIG. 7.

Figure 7:
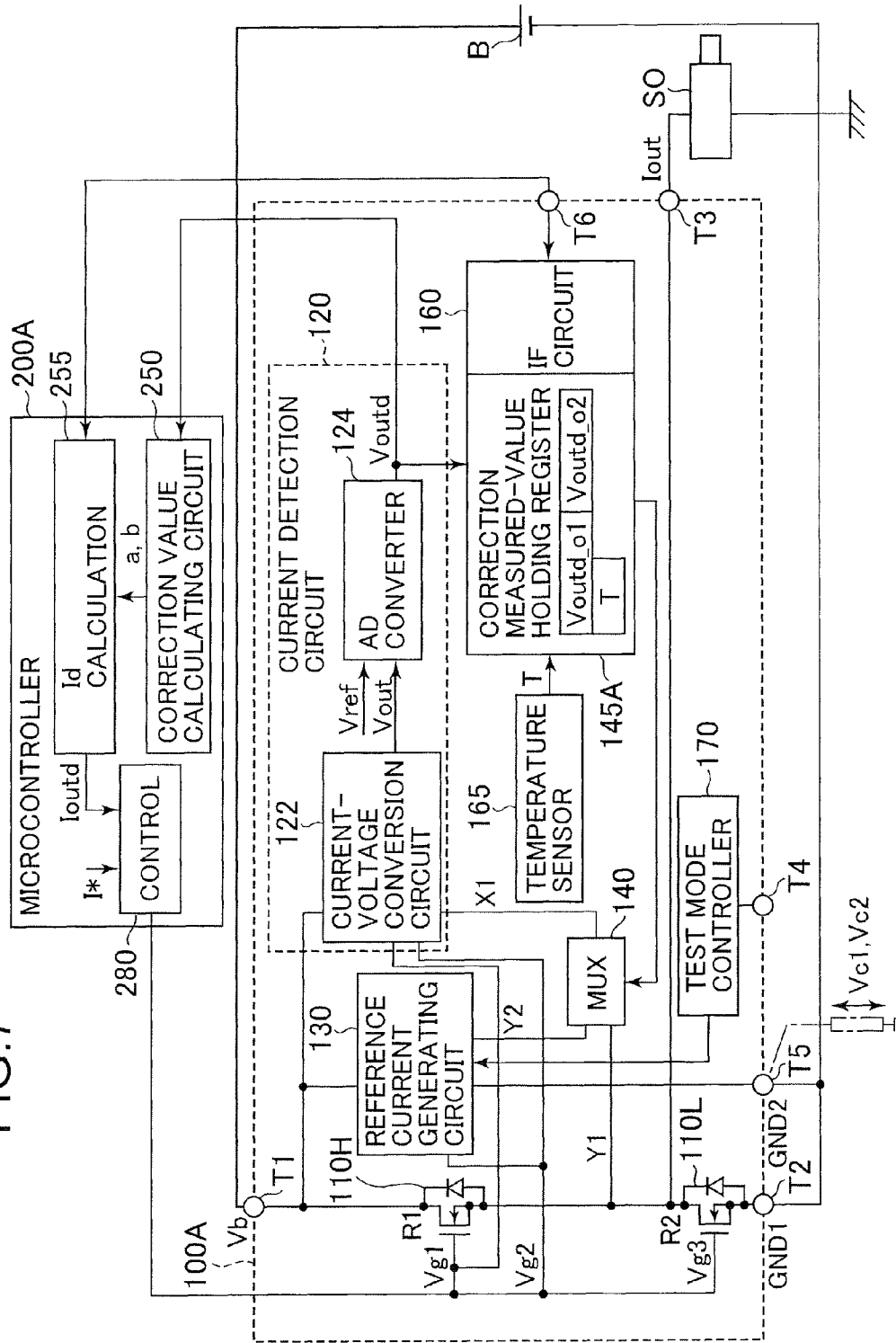
FIG. 7 is a block diagram illustrating an overall configuration of an electromotive actuator using a current-controlled semiconductor device according to another embodiment of the present invention.

FIG. 7 is a block diagram showing an overall configuration of the electromotive actuator using the current-controlled semiconductor device according to another embodiment of the present invention. Incidentally, the same reference numerals as in FIG. 1 denote the same parts in FIG. 7.

In the example shown in FIG. 1, the correction value calculating circuit 150, the digital current calculating circuit 155 and the feedback controller 180 have been incorporated in the current-controlled semiconductor device 100.

On the other hand, in the present embodiment, they are incorporated in a microcontroller 200A as a correction value calculating circuit 250, a digital current calculating circuit 255, and a feedback controller 280.

In a current-controlled semiconductor device 100A, a current measurement-based correction measured-value holding register 145A holds measured values of digital values Voutdc1 and Voutdc2 of reference currents Ic1 and Ic2 and an output T of a temperature sensor 165 therein.

The correction value calculating circuit 250 and the digital current calculating circuit 255 in the microcontroller 200A are mounted as software. The correction value calculating circuit 250 reads the digital values Voutdc1 and Voutdc2 and the measure value T of temperature retained in the current measurement-based correction measured-value holding register 145 through an IF circuit 160 and thereby performs the correction of a gain $\underline{a}$ and an offset $\underline{b}$ and a correction start decision or the like.

Then, the digital current calculating circuit 255 calculates a corrected digital current value Ioutd.

Since the correction of the gain $\underline{a}$ and the offset $\underline{b}$ may be performed with a period of a temperature change large in time constant, processing overhead to the microcontroller is less reduced even where the correction value calculating circuit 250 is implemented by software of the microcontroller, thus making it possible to easily mount the correction value calculating circuit 250.

According to the present embodiment as described above, since the current values of constant current sources incorporated in an IC chip are measured and the correction of a current detection circuit is carried out, a high-precision current detecting means can be realized within the single-chip IC.

Since the current values of the constant current sources are corrected using the values measured with a high degree of accuracy from outside in advance, the accuracy of correction can be enhanced.

Further, the area required to incorporate the correction value calculating circuit 250 into the current-controlled semiconductor device can be reduced and the cost of the current-controlled semiconductor device can be lowered.

A configuration and operation of an automatic transmission control unit using current-controlled semiconductor devices according to respective embodiments of the present invention will next be explained using FIG. 8.

FIG. 8 is a block diagram showing the configuration of the automatic transmission control unit using the current-controlled semiconductor devices according to the respective embodiments of the present invention. Incidentally, the same reference numerals as in FIGS. 1 and 7 denote the same parts in FIG. 8.

The automatic transmission control unit ATCU comprises the microcontroller 200 shown in FIG. 1, and a plurality of current-controlled semiconductor devices 100a, . . . , and 100e each corresponding to the current-controlled semiconductor device 100. Incidentally, the automatic transmission control unit ATCU can also comprise the microcontroller 200A shown in FIG. 7, and a plurality of current-controlled semiconductor devices 100a, . . . , and 100e each corresponding to the current-controlled semiconductor device 100A.

The microcontroller 200 inputs sensor values from an engine speed sensor 302, a shift lever position sensor 304, and an accelerator pedal position sensor 306, computes the optimum transmission gear ratio from the input sensor values, computes command values for hydraulic pressure of plural clutches (not shown) included in an automatic transmission 300 and current-value command values of solenoids SOa, . . . , and SOe, corresponding to their hydraulic pressure, for realizing the optimum transmission gear ratio, and outputs the current-value command values Ia*, . . . , and Ie* to their corresponding current-controlled semiconductor devices 100a, . . . , and 100e.

Since high-accuracy current detection and current control can be carried out by the current-controlled semiconductor devices 100a, . . . , 100e as described in the above-mentioned respective embodiments, smooth transmission is enabled and the riding comfort of a car is improved.

Incidentally, although the microcontroller 200 inputs the sensor values from the three sensors of the engine speed sensor 302, the shift lever position sensor 304, and the accelerator pedal position sensor 306 in FIG. 8, the number of sensors used for the input of their sensor values thereto and the type thereof may be changed according to the shift control system. The microcontroller 200 inputs the sensor values directly from the sensors in FIG. 8, but may input them via another microcontroller or IC. Although FIG. 8 has shown the example in which the automatic transmission 300 is equipped with the five clutches, the number of clutches and the number of solenoid current controlling devices corresponding thereto may be changed corresponding to the transmission mechanism.

A configuration and operation of a brake control unit using the current-controlled semiconductor device according to each embodiment of the present invention will next be described using FIG. 9.

FIG. 9 is a block diagram showing the configuration of the brake control unit using the current-controlled semiconductor device according to each embodiment of the present invention. Incidentally, the same reference numerals as in FIGS. 1 and 7 denote the same parts in FIG. 9.

The brake control unit BCU comprises the microcontroller 200 and the current-controlled semiconductor device 100 both shown in FIG. 1. Incidentally, the brake control unit BCU can also comprise the microcontroller 200A and the current-controlled semiconductor device 100A both shown in FIG. 7.

The microcontroller 200 inputs sensor values from a brake pedal position sensor 402 and a vehicle speed sensor 404, computes the optimum braking force of brake from the input sensor values, computes a hydraulic pressure command value of the hydraulic brake 400 and a current-value command value of a solenoid SO corresponding to the hydraulic pressure thereof, for realizing the optimum braking force, and outputs the current-value command value I* to the current-controlled semiconductor device 100.

Since the current-controlled semiconductor device 100 can perform high-accuracy current detection and current control as described in the above-mentioned respective embodiments, smooth braking is enabled and the riding comfort of a car is improved.

Incidentally, although the microcontroller 200 has input the sensor values from the two sensors of the brake pedal position sensor 402 and the vehicle speed sensor 404 in FIG. 9, the number of sensors for the input of the sensor values thereto and the type thereof may be changed according to the braking system. The microcontroller 200 inputs the sensor values directly from the sensors in FIG. 9, but may input them therein via another microcontroller or IC.

A configuration and operation of a brushless motor control unit using the current-controlled semiconductor devices according to the respective embodiments of the present invention will next be explained using FIG. 10.

FIG. 10 is a block diagram showing the configuration of the brushless motor control unit using the current-controlled semiconductor devices according to the respective embodiments of the present invention. Incidentally, the same reference numerals as in FIGS. 1 and 7 denote the same parts in FIG. 10.

The brushless motor control unit MCU comprises the microcontroller 200 and the current-controlled semiconductor device 100 both shown in FIG. 1. Incidentally, the brushless motor control unit BCU can also comprise the microcontroller 200A and the current-controlled semiconductor device 100A both shown in FIG. 7.

The microcontroller 200 computes the target number of revolutions of a motor 500 and three-phase current-value command values relative to three-phase coils Cu, Cv, and Cw of the motor 500 for realizing torque, and outputs the current-value command values Iu*, Iv*, and Iw* to their corresponding current-controlled semiconductor devices 100a, . . . , and 100c.

Since the current-controlled semiconductor devices 100a, . . . , and 100c can perform high-accuracy current detection and current control as described in the above-mentioned respective embodiments, smooth motor control is enabled.

What is claimed is:

1. A current-controlled semiconductor device comprising:
   a MOSFET;
   at least two constant current sources; and
   a current detection circuit for detecting a current of the MOSFET and currents of the constant current sources;
   wherein the MOSFET, the at least two constant current sources, and the current detection circuit are provided on the same semiconductor chip; and
   further comprising an external connecting terminal which is equipped with the at least two constant current sources, and for measuring values of the currents of the at least two constant current sources.

2. The current-controlled semiconductor device according to claim 1,
   further comprising a memory element for retaining therein current values of the constant current sources measured from outside of the current-controlled semiconductor device using the external connecting terminal or current values obtained when the current detection circuit has measured the currents of the constant current sources.

3. The current-controlled semiconductor device according to claim 2, further comprising:
   correction value calculating means for calculating corrected values of both gain and offset of the current detection circuit using the values retained in the memory element; and
   current value calculating means for correcting a corresponding value detected by the current detection circuit using the corrected values of the gain and offset calculated by the correction value calculating means to thereby calculate a corrected current value.

4. The current-controlled semiconductor device according to claim 3,
wherein the correction value calculating means performs a start decision as to a correction value calculating circuit using a temperature measured value of the current-controlled semiconductor device when a difference between the temperature measured value and a temperature at the time that correction is performed last time is greater than or equal to a predetermined value.

5. The current-controlled semiconductor device according to claim 4,
wherein the current-controlled semiconductor device turns on and off a voltage flowing through a load by PWM (pulse width modulation),
wherein, when an off period of the PWM is longer than a period required to measure the currents of the two constant current sources, the correction value calculating means measures the currents of the two constant current sources during the off period of the PWM, and
wherein, when the off period of the PWM is shorter than the period required to measure the currents of the two constant current sources, the correction value calculating means measures the currents of the two constant current sources during a period other than at the instant following a PWM on within an on period of the PWM.

6. A control unit comprising:
at least one current-controlled semiconductor device; and
a microcontroller for controlling the current-controlled semiconductor device,
wherein the current-controlled semiconductor device is provided on the same semiconductor chip with:
a MOSFET;
at least two constant current sources; and
a current detection circuit for detecting a current of the MOSFET and currents of the constant current sources; and
a memory element for retaining therein current values obtained when the current detection circuit has measured the currents of the constant current sources, and
wherein the microcontroller includes:
correction value calculating means for calculating corrected values of both gain and offset of the current detection circuit using the values retained in the memory element; and
current value calculating means for correcting a corresponding value detected by the current detection circuit using the corrected values of the gain and offset calculated by the correction value calculating means to thereby calculate a corrected current value.

7. The control unit according to claim 6,
wherein the correction value calculating means performs a start decision as to a correction value calculating circuit using a temperature measured value of the current-controlled semiconductor device when a difference between the temperature measured value and a temperature at the time that correction is performed last time is greater than or equal to a predetermined value.

8. The control unit according to claim 7,
wherein the current-controlled semiconductor device turns on and off a voltage flowing through a load by PWM (pulse width modulation),
wherein, when an off period of the PWM is longer than a period required to measure the currents of the two constant current sources, the correction value calculating means measures the currents of the two constant current sources during the off period of the PWM, and
wherein, when the off period of the PWM is shorter than the period required to measure the currents of the two constant current sources, the correction value calculating means measures the currents of the two constant current sources during a period other than at the instant following a PWM on within an on period of the PWM.

* * * * *